(12) United States Patent
Aichi

(10) Patent No.: US 10,944,247 B2
(45) Date of Patent: Mar. 9, 2021

(54) ELECTRICAL CONNECTION BOX

(71) Applicant: Sumitomo Wiring Systems, Ltd., Mie (JP)

(72) Inventor: Junya Aichi, Mie (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 159 days.

(21) Appl. No.: 16/086,422

(22) PCT Filed: Mar. 2, 2017

(86) PCT No.: PCT/JP2017/008221
§ 371 (c)(1),
(2) Date: Sep. 19, 2018

(87) PCT Pub. No.: WO2017/163800
PCT Pub. Date: Sep. 28, 2017

(65) Prior Publication Data
US 2019/0103738 A1    Apr. 4, 2019

(30) Foreign Application Priority Data
Mar. 22, 2016 (JP) .............................. JP2016-056710

(51) Int. Cl.
*H02G 3/16* (2006.01)
*B60R 16/02* (2006.01)
(Continued)

(52) U.S. Cl.
CPC .............. *H02G 3/16* (2013.01); *B60R 16/02* (2013.01); *H01R 9/2458* (2013.01); *H05K 7/026* (2013.01);
(Continued)

(58) Field of Classification Search
CPC ............ H02G 3/16; H02G 3/08; H02G 3/081; H02G 3/18; B60R 16/02; B60R 16/0238;
(Continued)

(56) References Cited

U.S. PATENT DOCUMENTS 6,723,920 B2 * 4/2004 Higuchi ............. H01H 85/2045
174/50
7,347,733 B2 * 3/2008 Murakami ........... H01H 85/044
439/797
(Continued)

FOREIGN PATENT DOCUMENTS

JP    2001231130 A    8/2001
JP    2011035958 A    2/2011

OTHER PUBLICATIONS

International Search Report in Application No. PCT/JP2017/008221 dated Apr. 4, 2017.
(Continued)

*Primary Examiner* — Angel R Estrada
(74) *Attorney, Agent, or Firm* — Honigman LLP

(57) ABSTRACT

The electrical connection box includes a case, a frame that is made of a synthetic resin and whose position is fixed relative to the case, fixed terminals that are fixed to the frame and can be connected to external terminals, a fuse having terminals that are put over the fixed terminals, stud bolts for fastening the external terminals, the fixed terminals, and the terminals of the fuse together, and a holding member that holds the stud bolts. The frame includes an attached portion to which the holding member is attached.

16 Claims, 16 Drawing Sheets

(51) Int. Cl.
*H01R 9/24* (2006.01)
*H05K 7/02* (2006.01)
*B60R 16/023* (2006.01)

(52) U.S. Cl.
CPC ...... *B60R 16/0238* (2013.01); *H01R 2201/26* (2013.01)

(58) Field of Classification Search
CPC ... B60R 16/00; B60R 16/0239; H01R 9/2458; H01R 2201/26; H01R 9/24; H01R 9/2408; H05K 7/026; H05K 7/00; H05K 5/00; H05K 5/02; H05K 5/0204; H05K 5/0217; H05K 5/0247; H05K 5/04
USPC ..... 174/50, 59, 520, 53, 57, 17 R; 439/76.1, 439/76.2, 949; 361/600, 601, 602, 605, 361/622, 641, 837; 220/3.2, 3.9, 4.02
See application file for complete search history.

(56) References Cited

U.S. PATENT DOCUMENTS

| | | | |
|---|---|---|---|
| 7,893,364 B2 * | 2/2011 | Oda | H05K 7/026 174/520 |
| 10,238,917 B1 * | 3/2019 | Kojayan | A63B 24/0087 |
| 2007/0091547 A1 | 4/2007 | Murakami | |

OTHER PUBLICATIONS

Written Opinion of the ISA in Application No. PCT/JP2017/008221 dated Apr. 4, 2017.

\* cited by examiner

ELECTRICAL CONNECTION BOX

CROSS-REFERENCE TO RELATED APPLICATIONS

This application is the U.S. national stage of PCT/JP2017/008221 filed Mar. 2, 2017, which claims priority of Japanese Patent Application No. JP 2016-056710 filed Mar. 22, 2016.

TECHNICAL FIELD

The technology described in this specification relates to an electrical connection box.

BACKGROUND

Conventionally, a configuration is known in which a fuse is provided in an electrical connection box mounted in an automobile. A fuse holder in JP 10-255642A includes a fuse housing case in which a fuse is housed, and a lid for closing an opening of the fuse housing case. One fuse terminal portion of the fuse and an end portion of a bus bar are fastened to one fixing portion of the fuse housing case with a bolt, and the other fuse terminal portion of the fuse and a terminal at an end of a wire are fastened to the other fixing portion of the fuse housing case with a bolt. As a result of a bottom wall of the fuse housing case being screwed and fixed to the main body of an electrical connection box, the fuse holder is arranged in the electrical connection box.

In the above-described configuration in JP 10-255642A, to fix the fuse to the electrical connection box, a pair of fuse terminal portions needs to be fastened to a pair of fixing portions of the fuse housing case with bolts, and furthermore, the fuse housing case needs to be screwed to the main body of the electrical connection box. For this reason, more man-hours are required for such operations as screwing and bolt-fastening.

The technology described in this specification has been completed based on the foregoing situation, and aims to reduce the number of man-hours for operations for attaching a fuse.

SUMMARY

An electrical connection box described in this specification includes: a case; a frame that is made of a resin, a position of the frame being fixed relative to the case; a fixed terminal that is fixed to the frame and can be connected to an external terminal; a fuse having a terminal that is put over the fixed terminal; a fastening member for fastening the external terminal, the fixed terminal, and the terminal of the fuse together; and a holding member for holding the fastening member, wherein the frame includes an attached portion to which the holding member is attached.

With this configuration, upon the holding member that holds the fastening member being attached to the attached portion, and the external terminal, the fixed terminal, and the terminal of the fuse being fastened together with the fastening member, the positions of the external terminals and the terminal of the fuse can be fixed relative to the frame, since the fixed terminal is fixed to the frame. Thus, when the fixed terminal and the external terminal are fastened together with the fastening member, the terminal of the fuse can be fixed to the frame. Accordingly, an operation of screwing the terminal of the fuse can be omitted in the case where the fuse is connected at a position that is different from the position at which the fixed terminal is fastened. As a result, the number of man-hours for operations for attaching the fuse can be reduced.

The following embodiments are favorable embodiments of carrying out the technique described in this specification. The holding member includes a locking portion for locking the holding member to the attached portion so that the holding member can move within a range of a predetermined clearance. With this configuration, as a result of the holding member moving within the range of the predetermined clearance, the locking portion of the holding member can be locked to the attached portion of the frame, and the holding member can be readily temporarily held. In addition, since the fastening can be performed with the fastening member after thus temporarily holding the holding member, the operability during the fastening with the fastening member can be enhanced.

A fitting recessed portion into which at least a portion of an outer face of the fuse is fitted is formed in the holding member. With this configuration, the position of the fuse can be retained by the fitting recessed portion, and thus, the operability can be enhanced when the fuse is attached.

An insertion groove portion into which the fastening member is inserted from a direction perpendicular to an axial direction of the fastening member is formed in the holding member. With this configuration, the fastening member can be readily attached to the holding member.

A circuit board on which an electronic component is mounted, the circuit board having a conducting path, and a fixed bus bar that has the fixed terminal and passes through the frame are further provided, and the fixed bus bar is connected to the conducting path of the circuit board. With this configuration, power can be supplied to the circuit board via the fixed bus bar, and the position of the circuit board can be fixed relative to the frame.

The fuse includes a pair of terminals, a blowing portion that is connected between the pair of terminals and blows out when an overcurrent runs therethrough, and an exterior portion covering the blowing portion, a visual check portion that enables the blowing portion to be visually checked is formed in the exterior portion, and a visual check hole for exposing the visual check portion is formed in the attached portion to pass therethrough. With this configuration, whether or not the fuse has blown out can be checked from the visual check hole.

Advantageous Effects of Invention

The technology described in this specification enables the number of man-hours for operations for attaching a fuse to be reduced.

DETAILED DESCRIPTION OF PREFERRED EMBODIMENTS

Embodiment 1

Embodiment 1 will be described with reference to FIGS. 1 to 16.

An electrical connection box 10 is arranged in a power supply path between a power source, such as a battery, and a load, which is constituted by an in-vehicle electrical component such as a lamp, a driving motor, or the like, in a vehicle such as an electric vehicle or a hybrid vehicle, and can be used in a DC-DC converter, an inverter, or the like, for example. In the following description, an X direction, a Y direction, and a Z direction refer to a forward direction, a leftward direction, and an upward direction, respectively.

Electrical Connection Box 10

Figure 3:
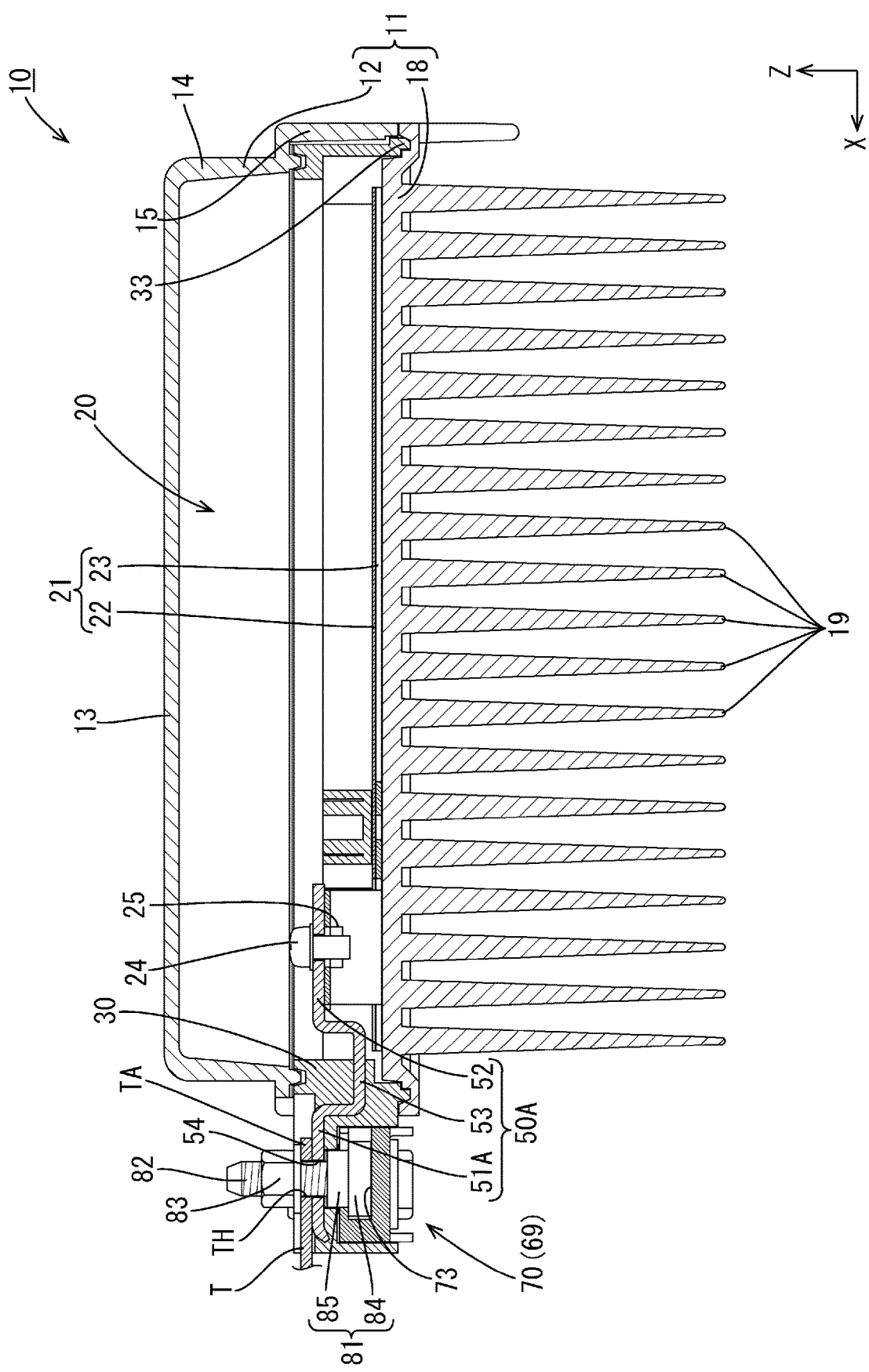
FIG. 3 is a cross-sectional view taken along a line A-A in FIG. 2.

As shown in FIG. 3, the electrical connection box 10 includes a case 11 and a frame unit 20, which is fixed to the case 11.

Case 11

Figure 5:
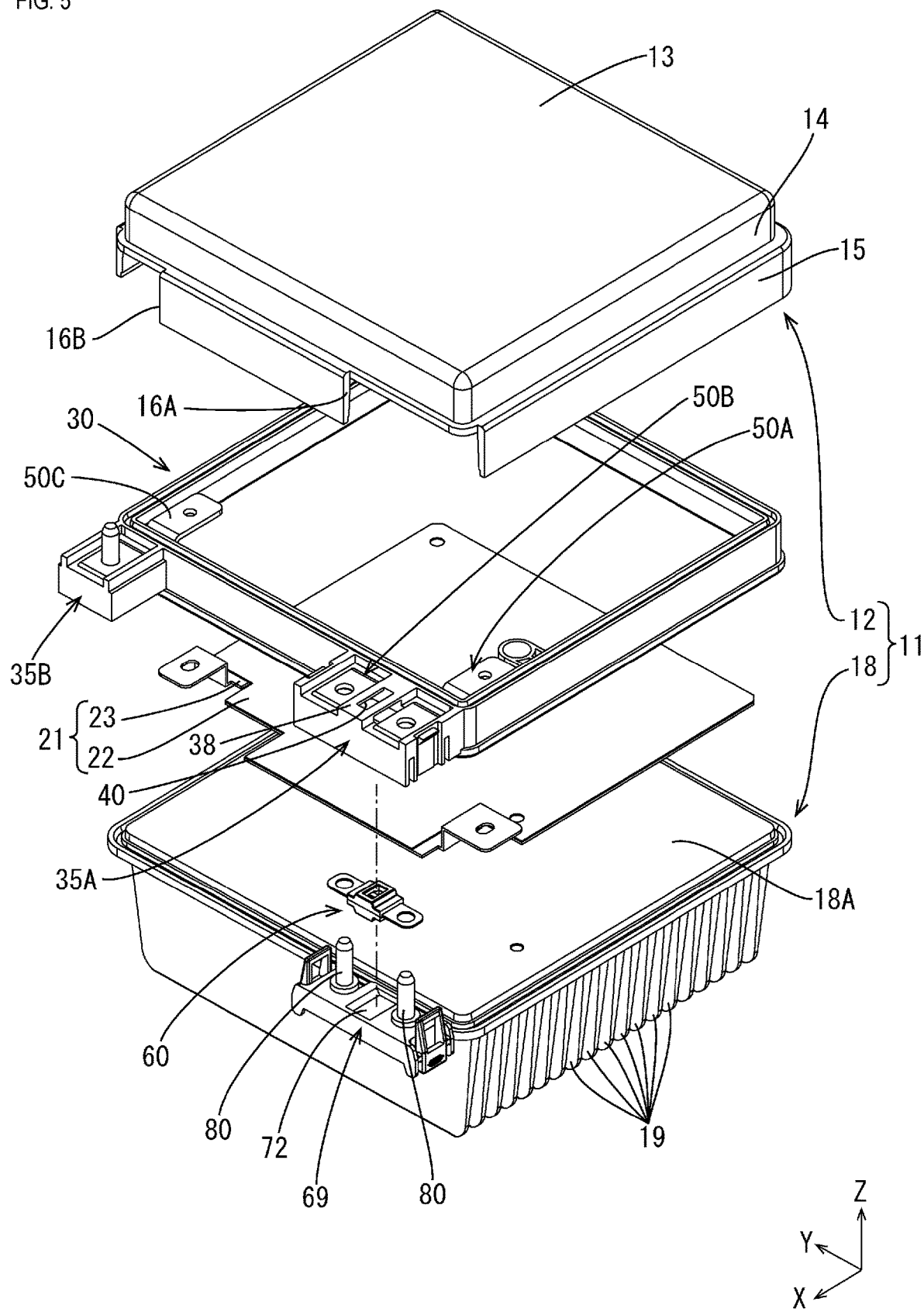
FIG. 5 is an exploded perspective view of the electrical connection box.

The case 11 is constituted by a shield cover 12 and a heat releasing member 18. The shield cover 12 is formed by punching and bending a thin metal plate that is made of aluminum, an aluminum alloy, iron, or the like. As shown in FIG. 5, the shield cover 12 includes a rectangular top plate portion 13 and a peripheral wall portion 14 that extends downward from a peripheral edge of the top plate portion 13, and is open on the lower end side. The size of the peripheral wall portion 14 increases on the lower side to form a step, thereby forming a frame cover portion 15 that covers an outer face of a frame 30. The frame cover portion 15 is cut out to form rectangular cutout portions 16A and 16b for leading later-described protruding portions 35A and 35B of the frame 30 to the outside of the case 11. The heat releasing member 18 is made of, for example, a highly heat-conductive metal, such as aluminum or an aluminum alloy, and is molded by means of aluminum die casting or the like. The heat releasing member 18 has a flat upper face 18A on which a circuit board 21 is placed, and a plurality of heat releasing fins 19 are lined up on the lower face like comb teeth.

Frame Unit 20

The frame unit 20 includes the frame 30 that is fitted to the case 11, the position of the frame 30 being fixed relative to the case 11, the circuit board 21 that is fixed to the frame 30, a plurality of fixed bus bars 50A to 50C that pass through the frame 30 and are fixed thereto, a fuse 60 that is connected between the fixed bus bars 50A and 50B, and a holding member 69 with bolts in which a pair of stud bolts 80 (each of which is an example of a "fastening member") are held.

Circuit Board 21

Figure 6:
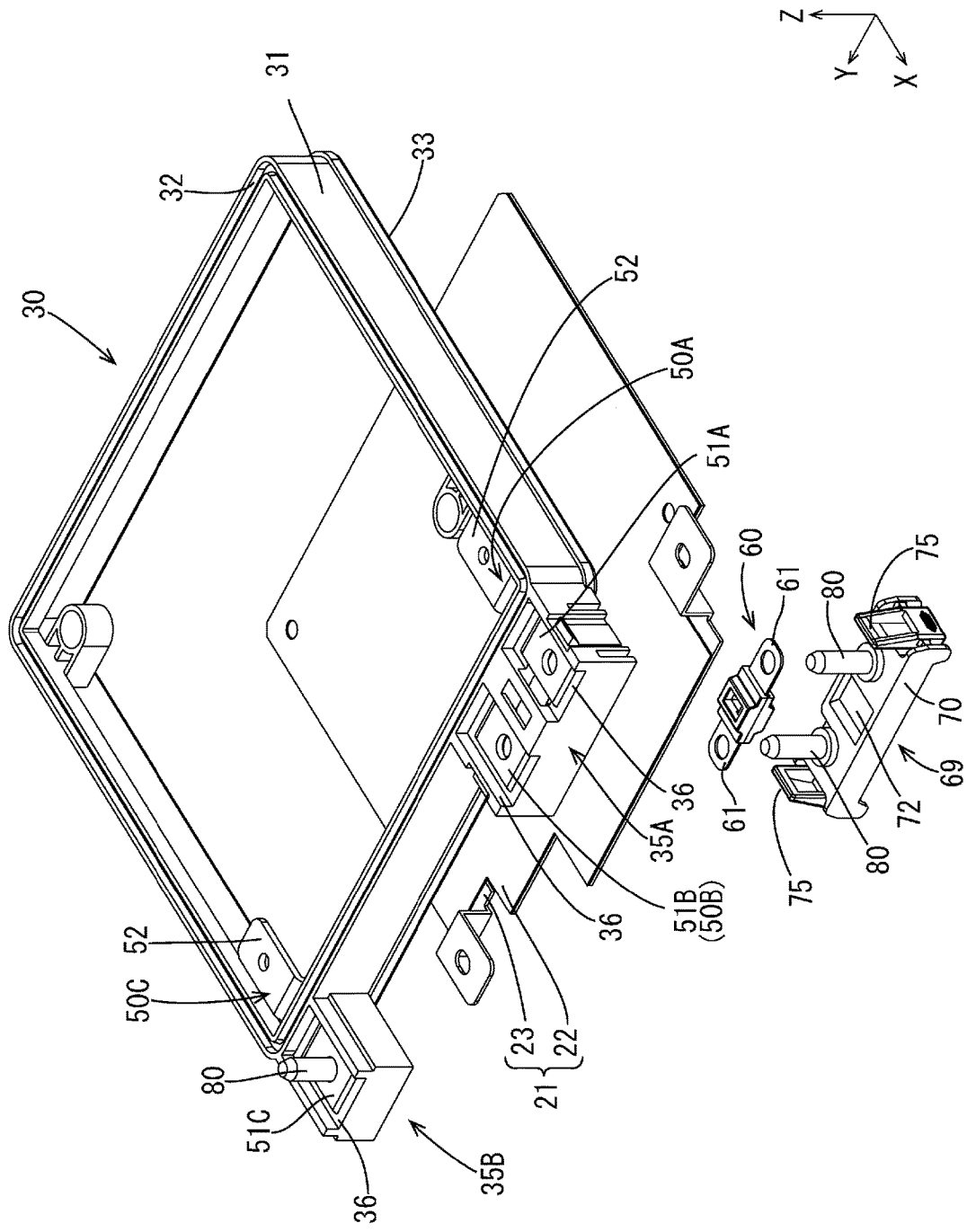
FIG. 6 is an exploded perspective view of a frame unit.
Figure 7:
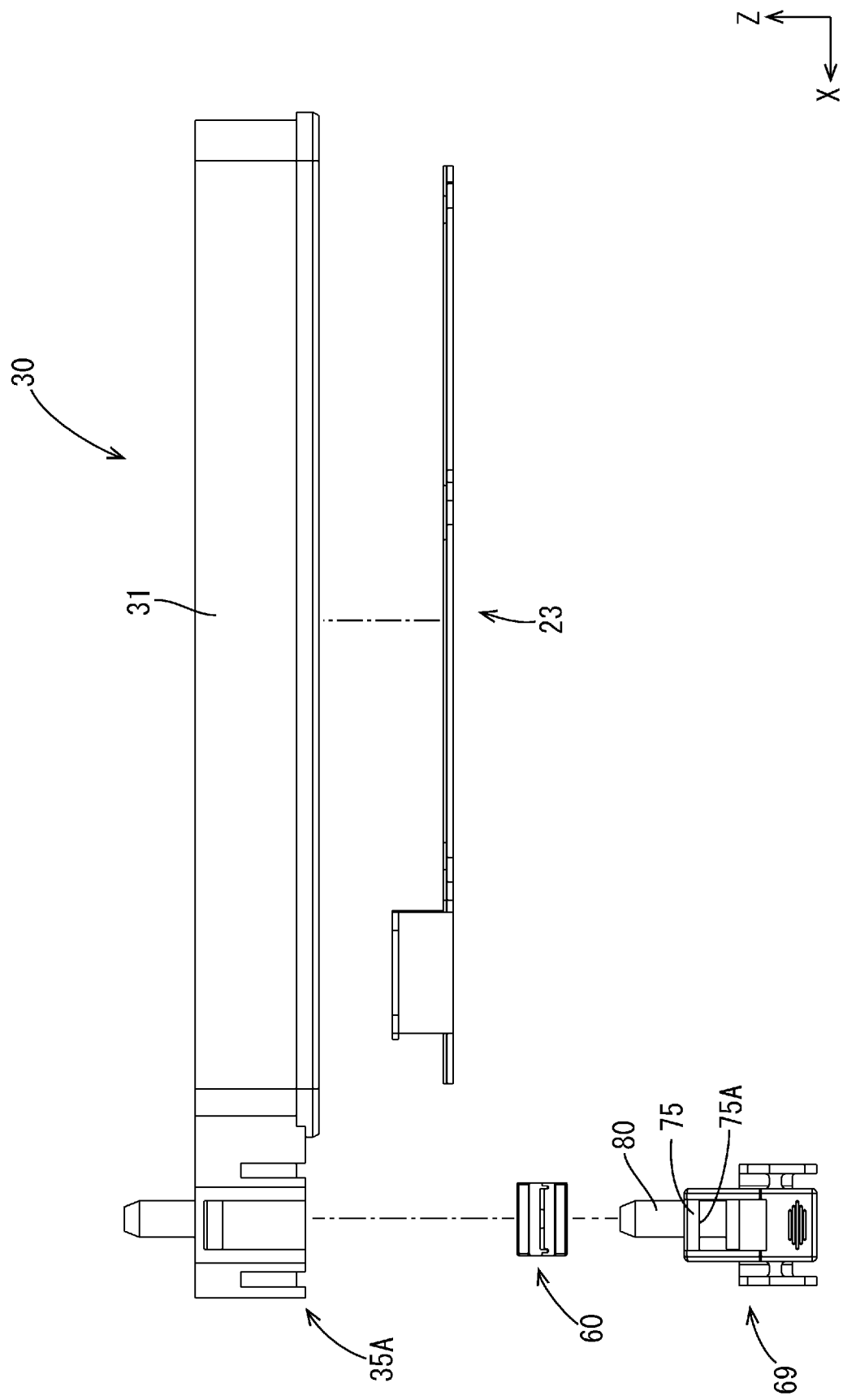
FIG. 7 is an exploded right side view of the frame unit.

As shown in FIG. 6, the circuit board 21 is configured by stacking a printed circuit board 22, in which conducting paths that are made of copper foil or the like are formed on an insulating plate by means of printed wiring technology, and a bus bar 23 that is made of a metal plate material. Electronic components (not shown), which may include a switching element such as an FET (Field Effect Transistor) and a capacitor, are mounted on the circuit board 21.

Frame 30

The frame 30 is made of an insulating synthetic resin, and includes a main body portion 31 that has a frame shape formed along a lower edge portion of the shield cover 12 and the periphery of the heat releasing member 18, and the protruding portions 35A and 35B that protrude outward of the shield cover 12 through the cutout portions 16A and 16B of the shield cover 12. The main body portion 31 is formed into a rectangular ring shape, and extends in a band shape with predetermined height and thickness. A fitting groove 32, into which a lower end edge of the shield cover 12 is fitted, is formed over the perimeter of an upper end portion of the main body portion 31. A protrusion 33, which protrudes outward to form a small step and is fitted into a groove portion 18B of the heat releasing member 18, is formed over the perimeter of a lower end portion of the main body portion 31.

Figure 8:
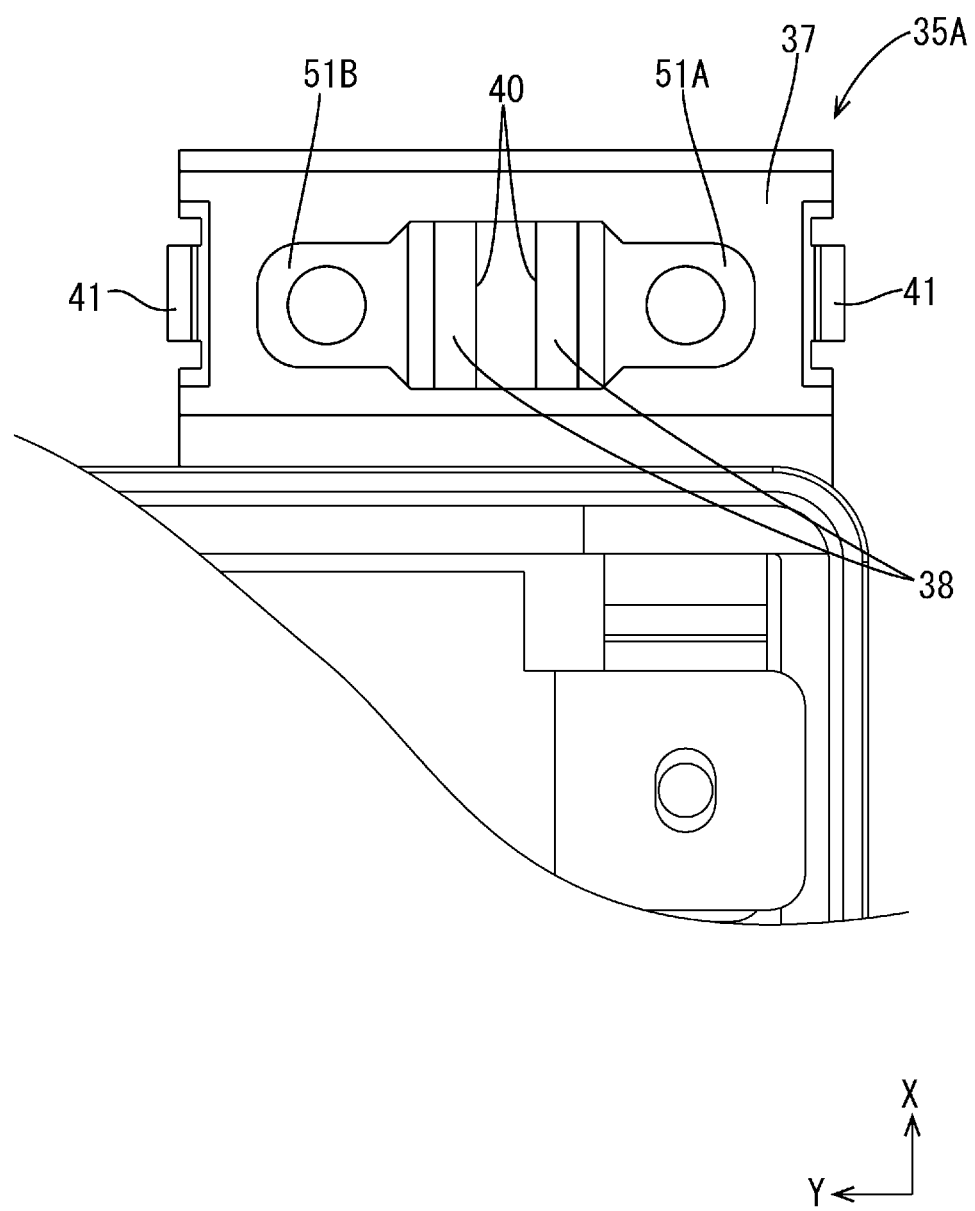
FIG. 8 is a bottom view enlarging a region near an attached portion.
Figure 9:
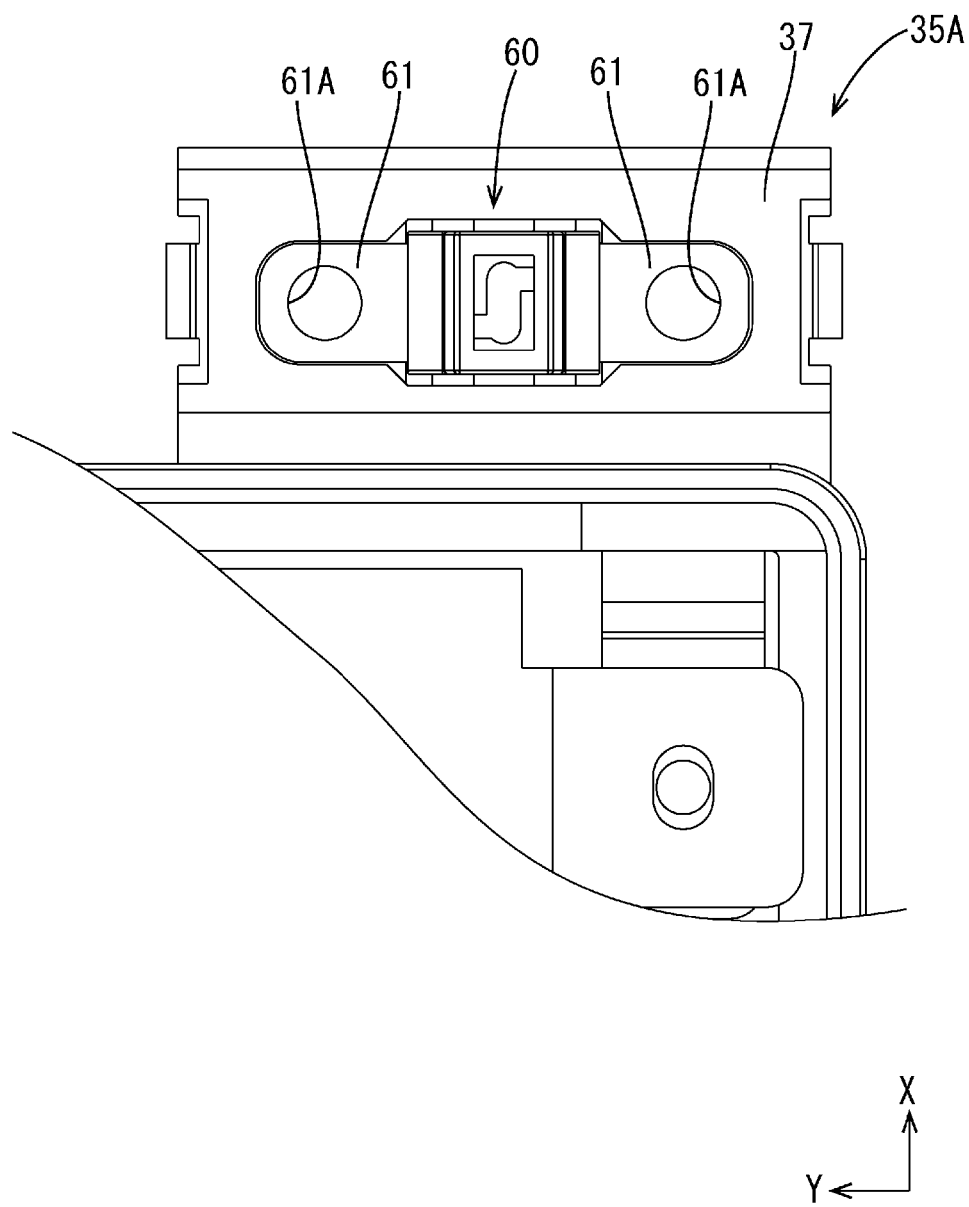
FIG. 9 is a bottom view showing a state where a fuse is arranged in the attached portion in FIG. 8.
Figure 10:
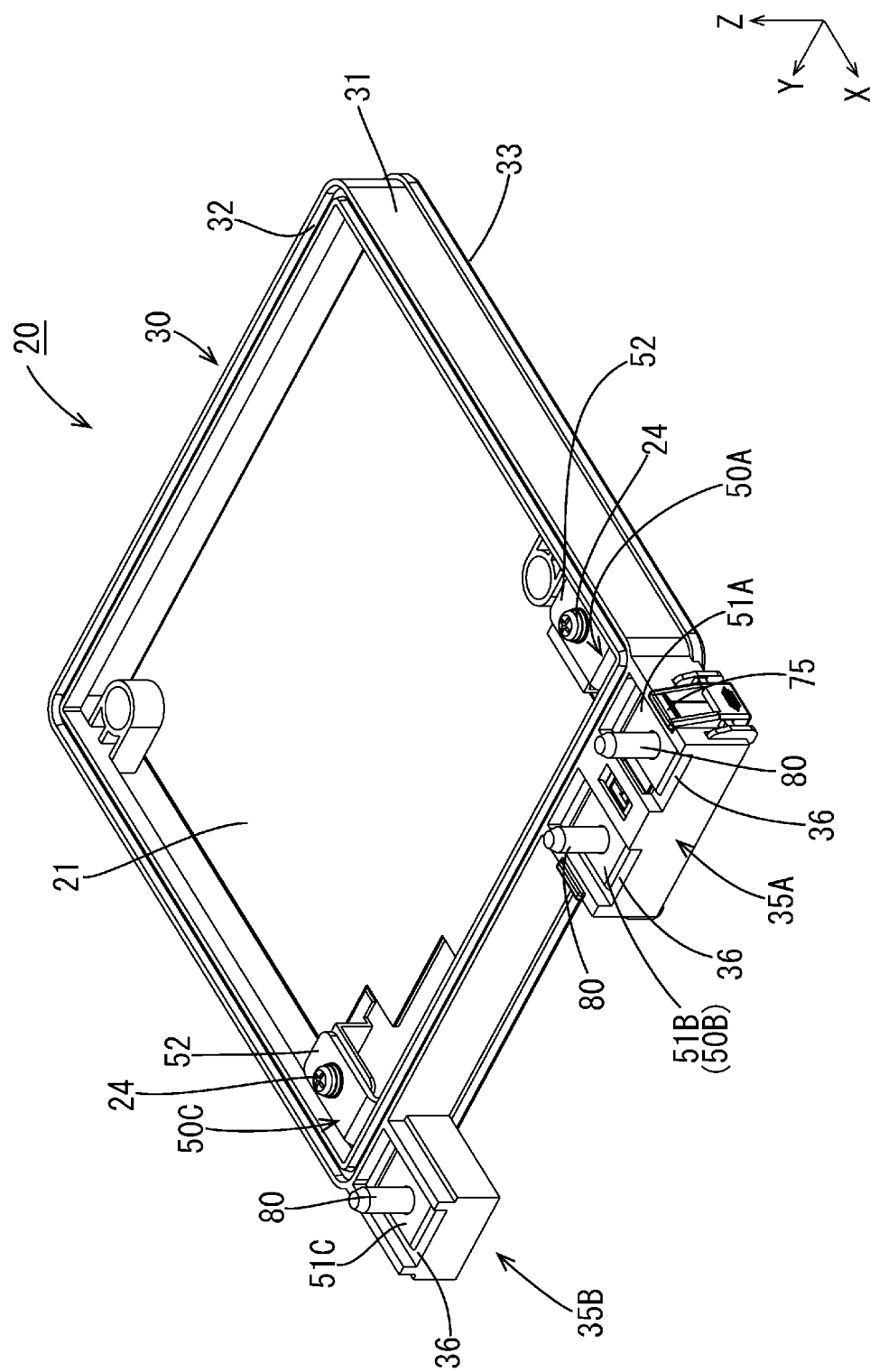
FIG. 10 is a perspective view of the frame unit.

The protruding portions 35A and 35B are integrally formed with the main body portion 31 on a front face side of the main body portion 31, and have recessed portions 36 that are formed by cutting out upper and lower faces of the protruding portions 35A and 35B in accordance with the positions of the fixed terminals 51A and 51C. Upper and lower faces of the fixed terminals 51A to 51C arranged in the recessed portions 36 are exposed. The right protruding portion 35A has an attached portion 37, to which the holding member 69 with bolts is attached from a back face side, as shown in FIG. 8. The attached portion 37 has a plate-shaped partition wall 38 that is arranged on an upper side of the fuse 60, and locked portions 41 that are provided in outer faces of left and right side walls and to which locking portions 75 of the holding member 70 are locked.

The partition wall 38 is arranged at a position that is spaced apart upward from an exterior portion 63 of the fuse 60, and has a rectangular visual check hole 40 that passes through a center portion of the partition wall 38. The locked portions 41 protrude from respective side faces of the protruding portion 35A to form steps, and have inclined faces whereby the protrusions of the locked portions 41 gradually recede when following the locked portions 41 downward.

Fixed Bus Bars 50A to 50C

The fixed bus bars 50A to 50C are made of a metal such as copper, a copper alloy, aluminum, or an aluminum alloy, and respectively have fixed terminals 51A to 51C, as shown in FIG. 6, that are to be connected to external terminals T. As shown in FIG. 3, the fixed bus bar 50A extends in a bent band shape. The front side of the fixed bus bar 50A serves as the fixed terminal 51A, and the rear side thereof serves as a board connecting portion 52 that is screwed, with a screw 24 and a nut 25, and connected to a bus bar terminal extending from the bus bar 23 of the circuit board 21. A portion between the fixed terminal 51A and the board connecting portion 52 serves as a buried portion 53, which is buried in the frame 30. The fixed terminals 51A to 51C have circular insertion holes 54 that pass therethrough and into which shaft portions 82 of the stud bolts 80 are inserted. The fixed bus bars 50A to 50C are formed by punching and bending metal plate materials, and are integrally formed with the frame 30 by means of insert molding using a mold in which the fixed bus bars 50A to 50C are disposed.

Figure 1:
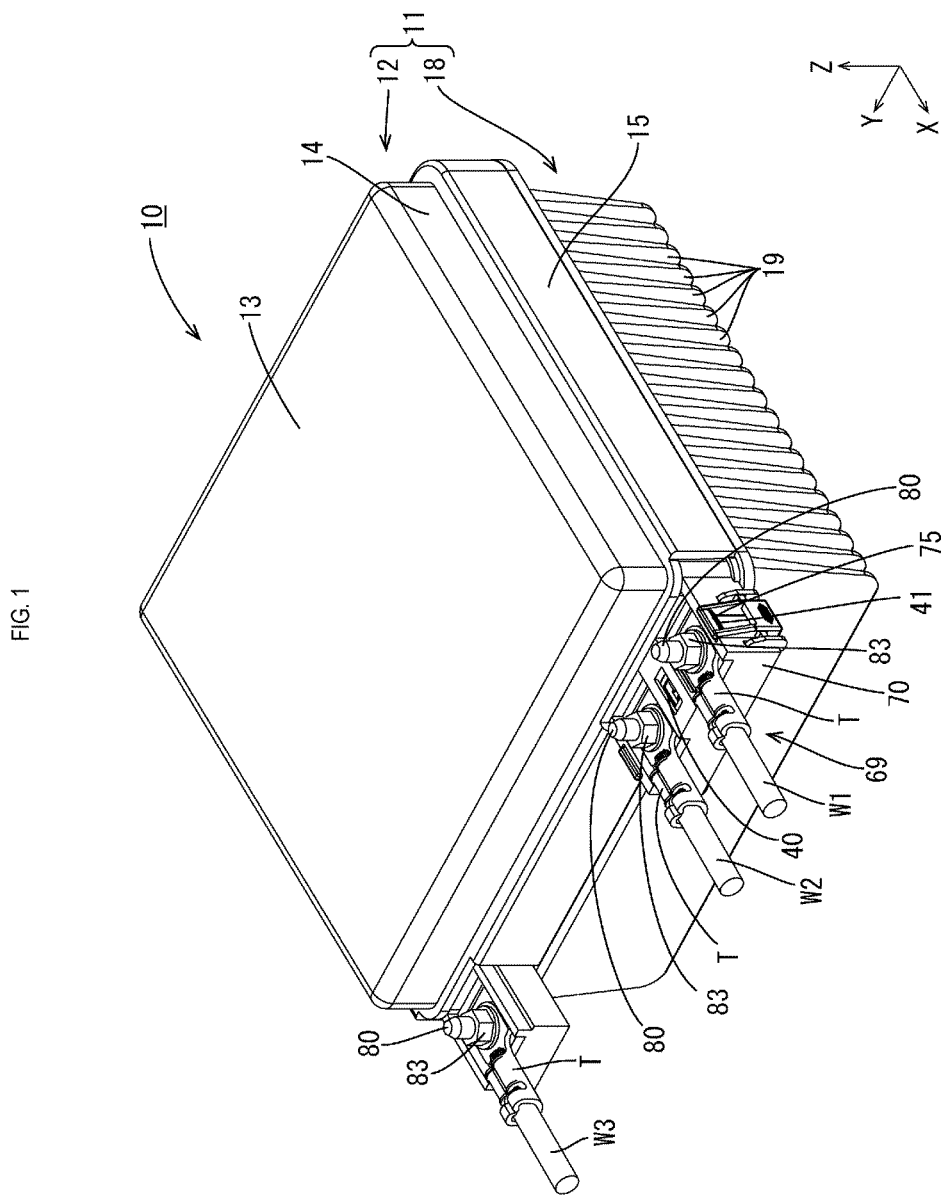
FIG. 1 is a perspective view of an electrical connection box according to Embodiment 1.
Figure 2:
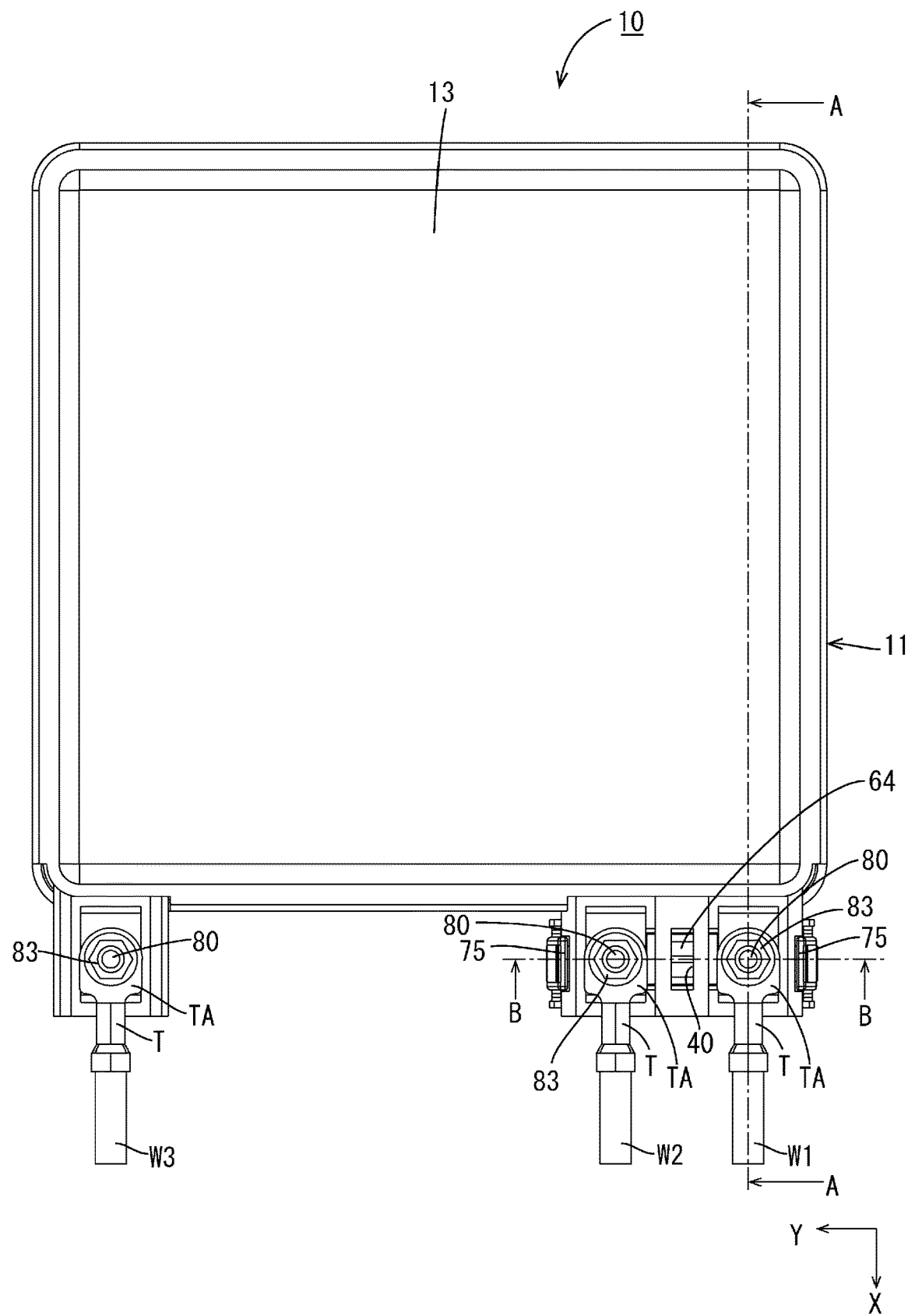
FIG. 2 is a plan view of the electrical connection box.

The external terminals T are attached to end portions of wires W1 to W3, as shown in FIG. 1. The external terminals T have barrel portions with which the wires W1 to W3 are to be crimped, for example. As shown in FIG. 3, a circular insertion hole TH, into which the shaft portion 82 of a corresponding stud bolt 80 is inserted, is formed to pass through a plate-shaped portion TA, which is provided at a leading end portion of each external terminal T and is laid over a corresponding one of the fixed terminals 51A to 51C. The wires W1 to W3 are covered wires in which an insulating layer is formed around a conductive portion. The wires W1 and W2 may be in phase with each other, for example, and are both on an input side and are connected to an external power source side (not shown), for example. Meanwhile, the wire W3 is on an output side, and is connected to an external device (not shown), for example. The wires W1 and W2 are electrically connected to each other via the fuse 60.

Fuse 60

Figure 4:
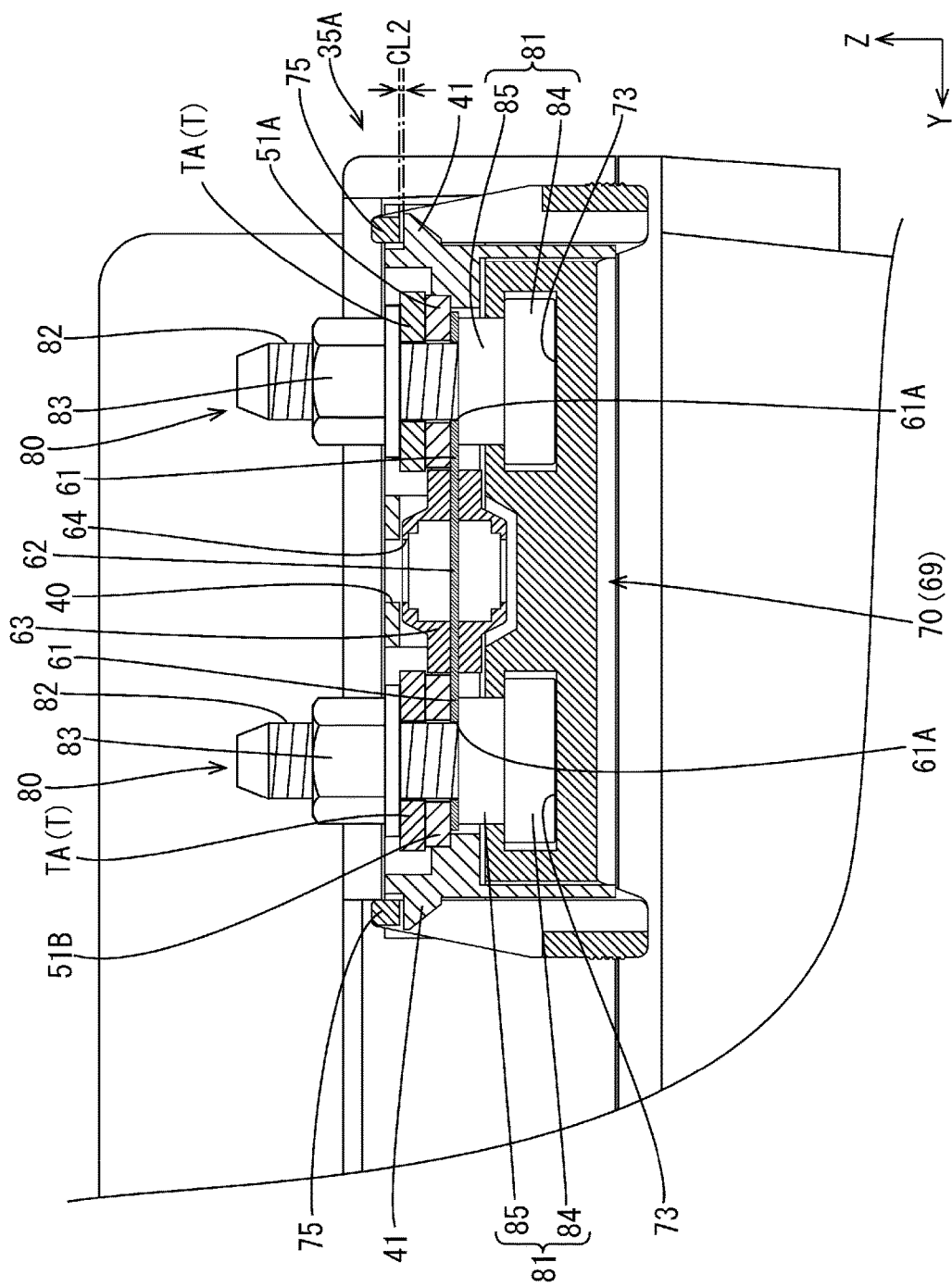
FIG. 4 is a cross-sectional view taken along a line B-B in FIG. 2.

The fuse 60 is a current-limiting fuse with large rated current and fusing current that is used in, for example, an electric vehicle or the like. As shown in FIG. 4, the fuse 60 includes a pair of terminals 61, a blowing (melting) portion 62 that is connected between the pair of terminals 61 and blows out when an overcurrent runs therethrough, and an exterior portion 63 that covers the blowing portion 62 and is made of an insulating synthetic resin. The terminals 61 are formed with a metal plate made of a metal such as copper, a copper alloy, aluminum, or an aluminum alloy, and have insertion holes 61A that are formed to pass through the terminals 61 and into which the shaft portions 82 of the stud bolts 80 can be inserted. A visual check portion 64 through which the blowing portion 62 can be visually checked is formed in the exterior portion 63. The visual check portion 64 can be formed with transparent resin or glass, for example. Whether or not the blowing portion 62 has blown out can be visually checked from above from the visual check portion 64 via the visual check hole 40 in the attached portion 37.

Holding Member 69 with Bolts

Figure 13:
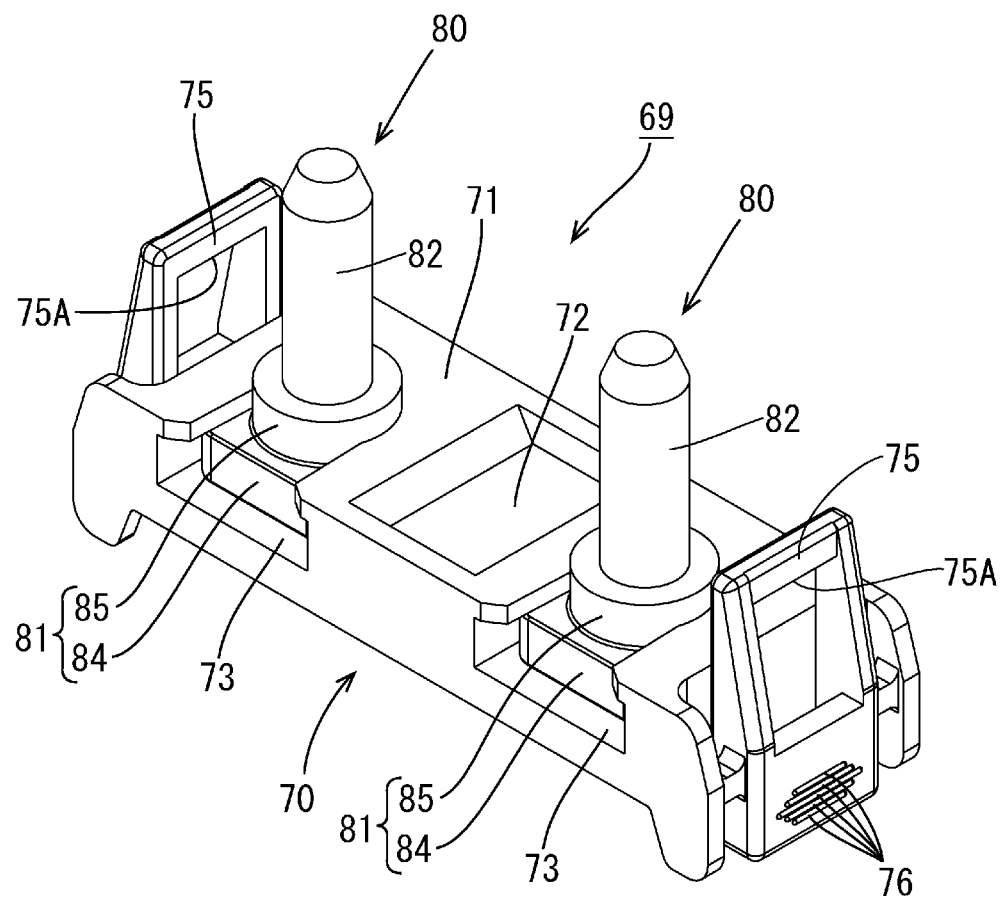
FIG. 13 is a perspective view of the holding member with bolts.
Figure 14:
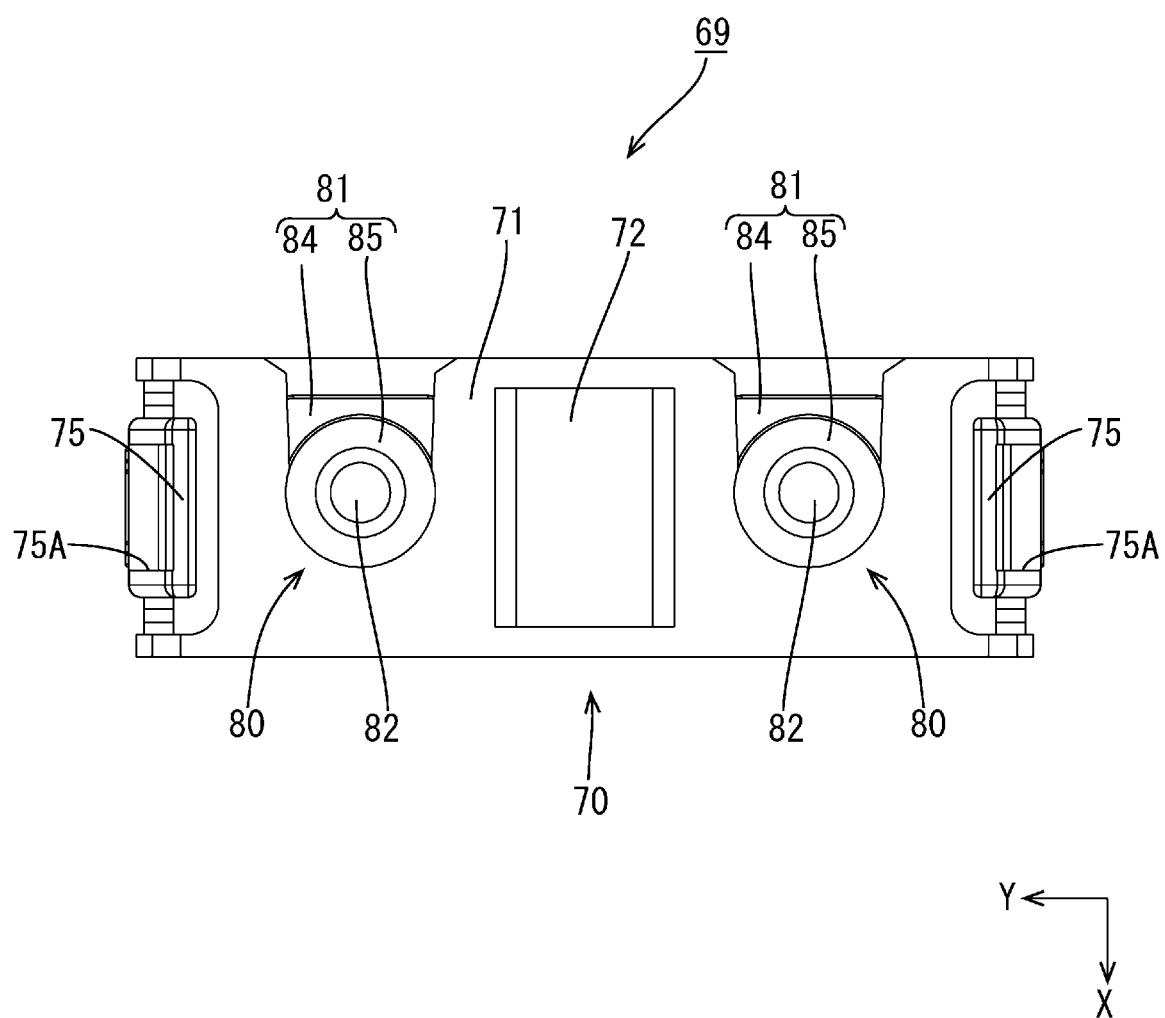
FIG. 14 is a plan view of the holding member with bolts.
Figure 15:
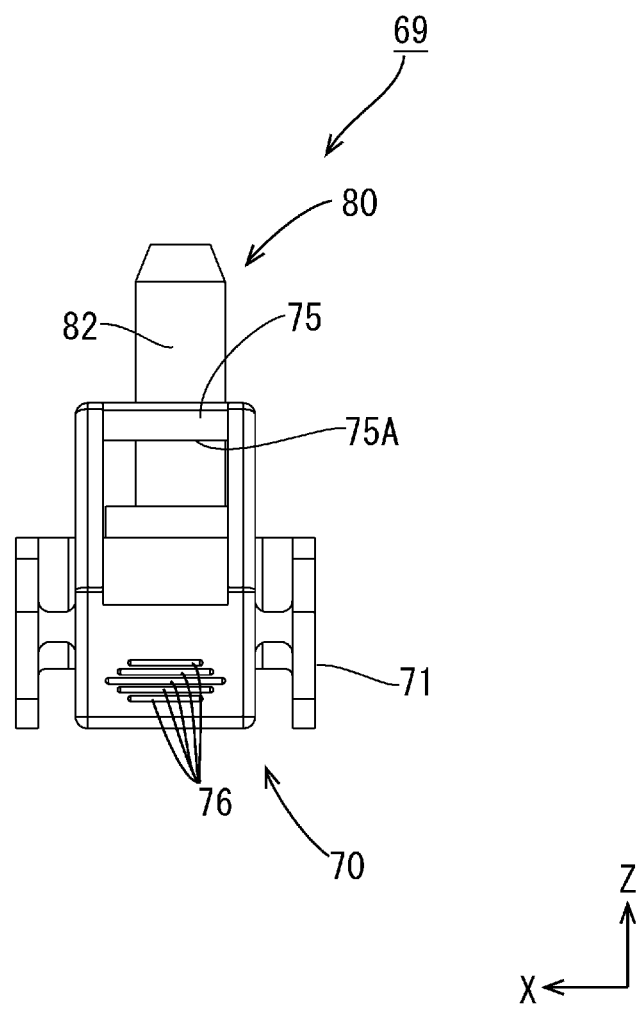
FIG. 15 is a right side view of the holding member with bolts.
Figure 16:
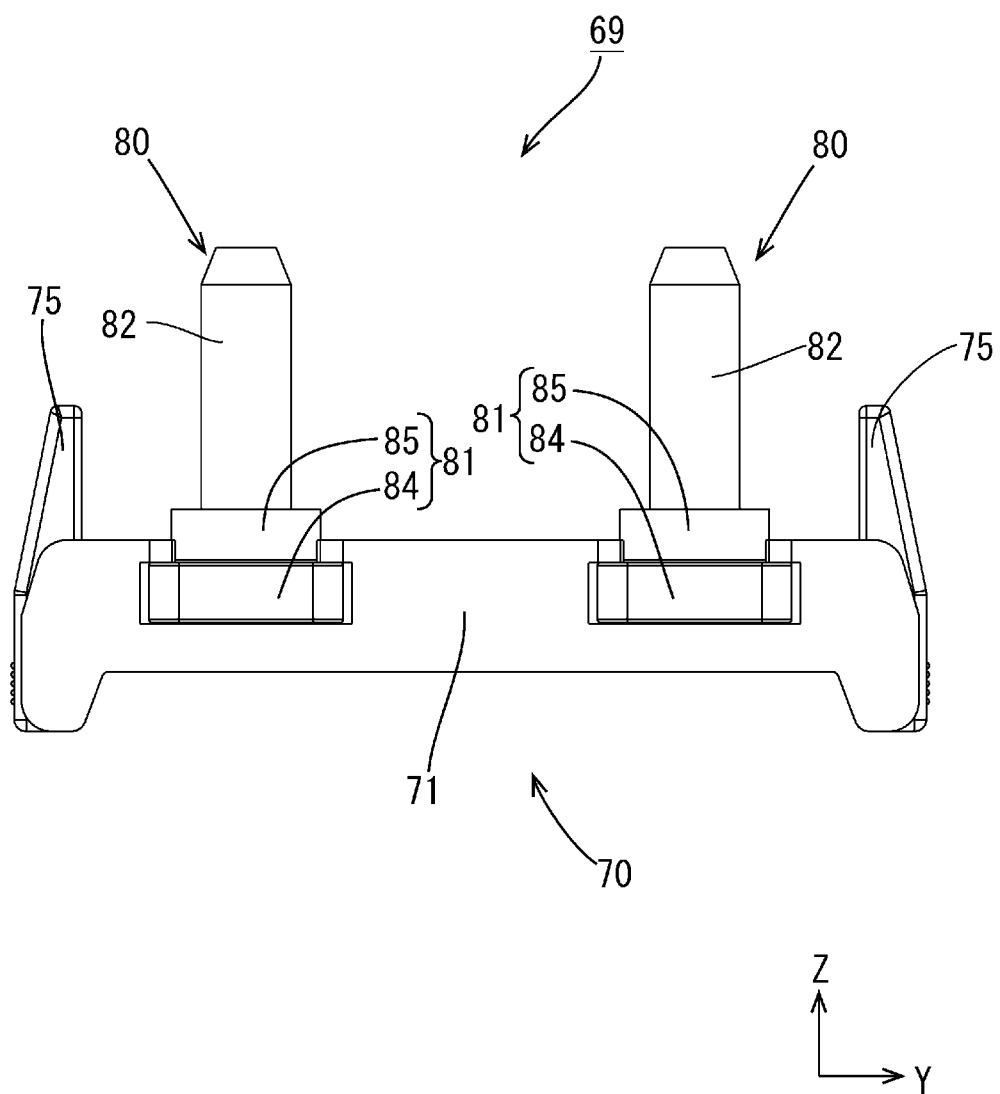
FIG. 16 is a back view of the holding member with bolts.

The holding member 69 with bolts includes a pair of stud bolts 80, and a holding member 70 that is made of an insulating synthetic resin and holds the pair of stud bolts 80, as shown in FIG. 13.

Stud Bolts 80

Each stud bolt 80 has a head portion 81 and a shaft portion 82 that is coaxially continuous with the head portion 81 and has a thread groove. The head portion 81 includes an insertion plate portion 84 that has a rectangular plate shape, and a fastening portion 85 that has a circular column shape and whose diameter expands relative to the shaft portion 82 to form a step. A nut 83 is screwed to the shaft portion 82, and a corresponding terminal 61 of the fuse 60, a corresponding one of the fixed terminals 51A and 51B, and a corresponding external terminal T are fastened together between an upper face of the fastening portion 85 and the nut 83.

Holding Member 70

The holding member 70 includes a thick plate-shaped holding portion 71 in which the stud bolts 80 are held, and locking portions 75 that are locked to the locked portions 41. A fitting recessed portion 72 into which the exterior portion 63 of the fuse 60 is fitted, and insertion groove portions 73 into which the insertion plate portions 84 of the stud bolts 80 are inserted from a direction perpendicular to the axial direction of the fastening members are formed in the holding portion 71. The fitting recessed portion 72 is recessed to form a shape that fits the shape of the exterior portion 63.

The insertion groove portions 73 are recessed portions that are cut out in a rectangular parallelepiped shape. Upon the insertion plate portions 84 of the stud bolts 80 being fitted into the insertion groove portions 73, the rotation of the stud bolts 80 is restricted. Upon the holding member 70 being attached to the attached portion 37, openings of the insertion groove portions 73 are covered by an inner wall of the attached portion 37, and thus separation of the stud bolts 80 is restricted. Each locking portion 75 is formed into a frame shape in which a locking hole 75A is formed to pass therethrough, and can be deformed on the upper side (leading end side) to bend in the left-right direction. As a result of step portions of the locked portions 41 being locked to hole edges of the locking holes 75A, separation of the holding member 70 from the attached portion 37 is restricted. A plurality of anti-slip protruding portions 76 that are to be grasped by an operator with fingers are arranged in a line on an outer face of a base end portion of each locking portion 75.

Next, attachment of the fuse 60 will be described.

Upon the insertion plate portions 84 of the stud bolts 80 being inserted into the insertion groove portions 73 of the holding member 70, the holding member 69 with bolts in which the stud bolts 80 are held by the holding member 70 is formed (FIG. 13). Then, upon the shaft portions 82 of the stud bolts 80 being inserted into the pair of insertion holes 61A in the fuse 60, the exterior portion 63 is fitted into the fitting recessed portion 72. Note that, before the stud bolts 80 are inserted into the insertion holes 61A in the fuse 60, the frame 30 may be inverted to arrange the fuse 60 on the attached portion 37 side (see FIG. 9). Then, upon the holding member 69 with bolts being attached to the attached portion 37 of the frame 30, the pair of locked portion portions 41 is locked to the pair of locking portions 75.

Figure 11:
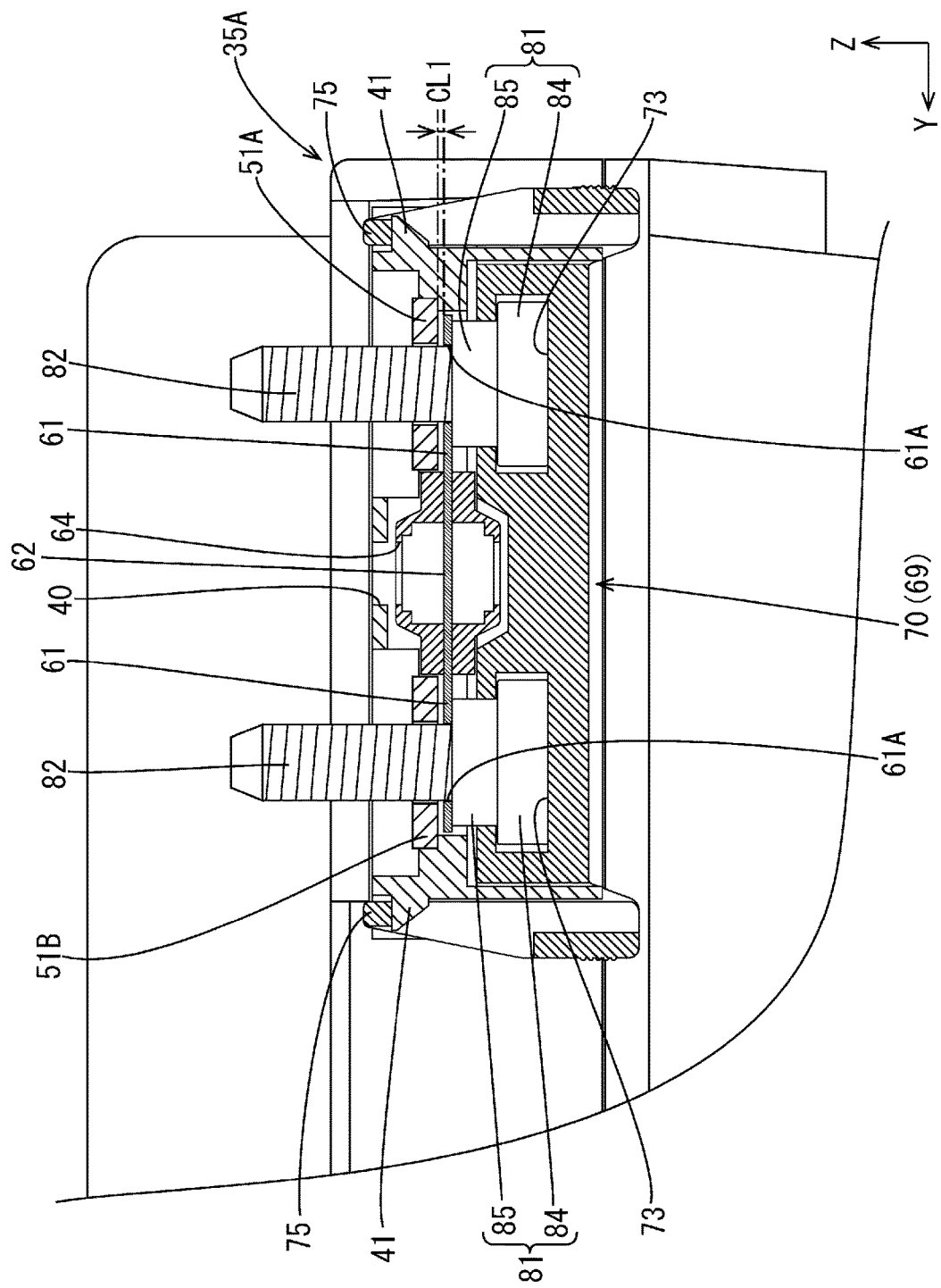
FIG. 11 is a cross-sectional view showing a state where a holding member with bolts is attached to the attached portion.
Figure 12:
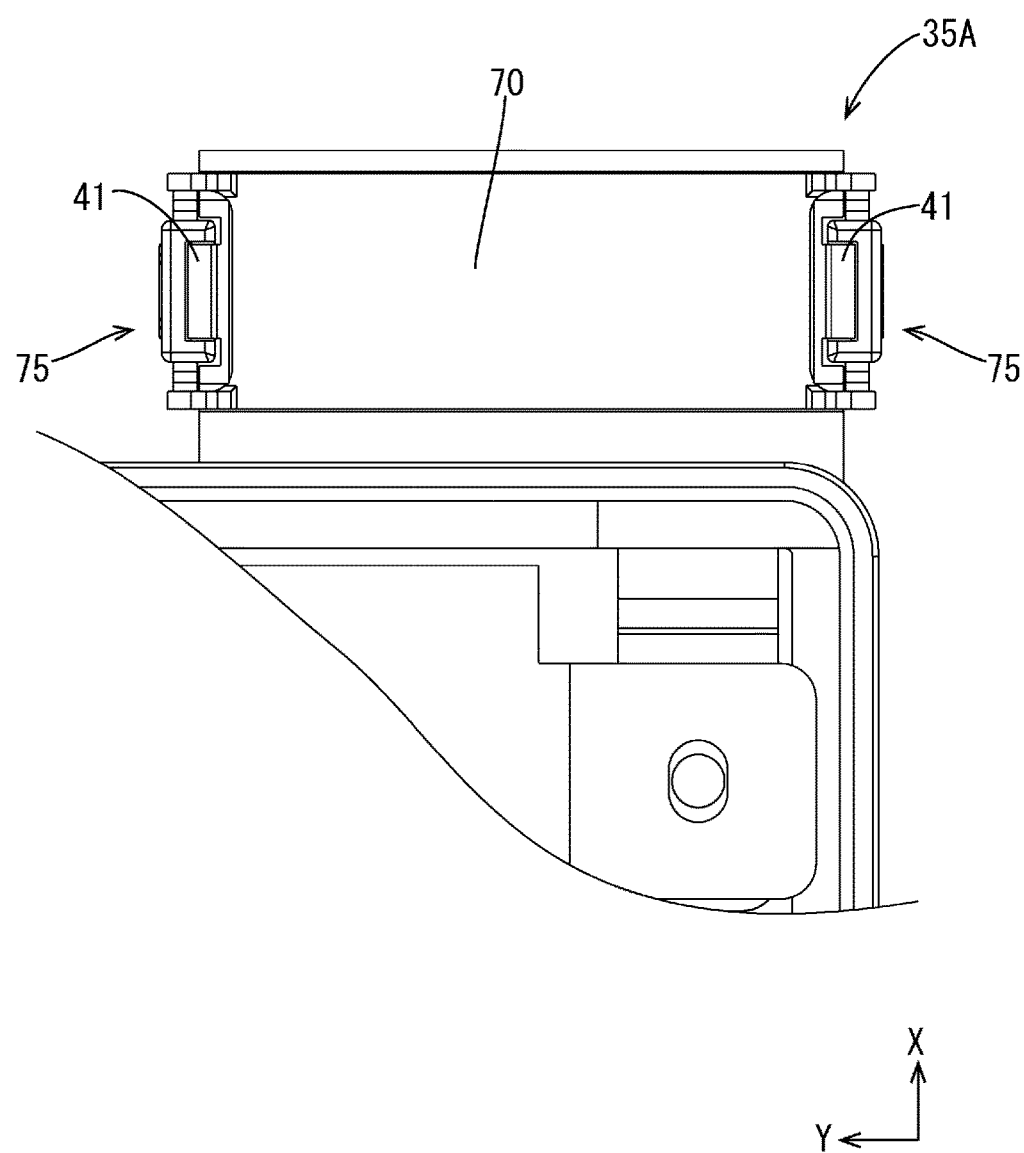
FIG. 12 is a bottom view showing a state where the holding member with bolts is attached to the attached portion in FIG. 9.

As a result, as shown in FIG. 11, a state is entered where the locking portions 75 and the locked portions 41 come into contact with each other. At this time, a clearance CL1 is formed between the fixed terminals 51A and 51B and the pair of terminals 61 of the fuse 60.

Next, the external terminals T attached to the end portions of the wires W1 to W3 are put over the fixed terminals 51A and 51B and are fastened together by threading the nuts 83 with the shaft portions 82 of the stud bolts 80. Then, the holding member 70 moves upward together with the stud bolts 80, and the clearance CL1 disappears. At this time, the fixed terminals 51A and 51B come into contact with the pair of terminals 61 of the fuse 60, and a clearance CL2 (CL2=CL1) is formed between the locking portions 75 and the locked portions 41 (FIG. 4).

Effects of this embodiment will be described.

The electrical connection box 10 includes the case 11, the frame 30 that is made of a synthetic resin and whose position is fixed relative to the case 11, the fixed terminals 51A and 51B that are fixed to the frame 30 and can be connected to the external terminals T, the fuse 60 having the terminals 61 that are put over the fixed terminals 51A and 51B, the stud bolts 80 (fastening member) for fastening the external terminals T, the fixed terminals 51A and 51B, and the terminals 61 of the fuse 60 together, and the holding member 70 that holds the stud bolts 80. The frame 30 includes the attached portion 37 to which the holding member 70 is attached.

According to this embodiment, upon the holding member 70 that holds the stud bolts 80 being attached to the attached portion 37, and the external terminals T, the fixed terminals 51A and 51B, and the terminals 61 of the fuse 60 being fastened together with the stud bolts 80 and the nuts 83, the positions of the external terminals T and the terminals 61 of the fuse 60 can be fixed relative to the frame 30, since the fixed terminals 51A and 51B are fixed to the frame 30. Thus, when the fixed terminals 51A and 51B and the external terminals T are fastened together with the stud bolts 80 and the nuts 83, the terminals 61 of the fuse 60 can be fixed to the frame 30. Accordingly, an operation of screwing the terminals 61 of the fuse 60 can be omitted in the case where the fuse 60 is connected at a position that is different from the position at which the fixed terminals 51A and 51B are fastened. As a result, the number of man-hours for operations for attaching the fuse 60 can be reduced.

The holding member 70 includes the locking portions 75 for locking the holding member 70 so that the holding member 70 can move within the range of a predetermined clearance CL1 (CL2) relative to the attached portion 37.

With this configuration, as a result of the holding member 70 moving within the range of the predetermined clearance CL1 (CL2), the locking portions 75 of the holding member 70 can be locked to the attached portion 37 of the frame 30, and the holding member 70 can be readily temporarily held. In addition, since the fastening can be performed with the stud bolts 80 and the nuts 83 after thus temporarily holding the holding member 70, the operability during the fastening with the stud bolts 80 and the nuts 83 can be enhanced.

The fitting recessed portion 72 into which the exterior portion 63 (at least a portion of the outer face) of the fuse 60 is fitted is formed in the holding member 70.

With this configuration, the position of the fuse 60 can be retained by the fitting recessed portion 72, and thus, the operability during operations of attaching the fuse 60 can be enhanced.

The insertion groove portions 73 into which the insertion plate portions 84 of the stud bolts 80 are inserted from a direction perpendicular to the up-down direction (axial direction of the stud bolts 80) are also formed in the holding member 70.

With this configuration, the stud bolts 80 can be readily attached to the holding member 70.

The circuit board 21 that includes conducting paths and on which electronic components are mounted, and the fixed bus bars 50A to 50C that have the fixed terminals 51A, 51B and 51C and pass through the frame 30 are also provided.

The fixed bus bars 50A to 50C are connected to the conducting paths on the circuit board 21.

With this configuration, power can be supplied to the circuit board 21 via the fixed bus bars 50A to 50C, and the position of the circuit board 21 can be fixed relative to the frame 30.

The fuse 60 includes the pair of terminals 61, and also includes the blowing portion 62 that is connected between the terminals 61 and blows out when an overcurrent runs therethrough, and the exterior portion 63 that covers the blowing portion 62. The visual check portion 64 through which the blowing portion 62 can be visually checked is formed in the exterior portion 63, and the visual check hole 40 from which the visual check portion 64 is exposed is formed in the attached portion 37 to pass therethrough.

With this configuration, whether or not the fuse 60 has blown out can be checked from the visual check hole 40.

Other Embodiments

The technology described in this specification is not limited to the embodiment described with the above description and the drawings, and for example, the following embodiments are also encompassed in the technical scope described in this specification.

Although a configuration in which the stud bolts 80 are held by the holding member 70 has been described, a configuration may also be employed in which the holding member 70 holds the nuts 83 each serving as the fastening member to form a holding member with nuts (fastening member), and bolts are fastened with the nuts 83.

Although a configuration in which the fixed bus bars 50A to 50C are formed in the frame 30 by means of insert molding, the present invention is not limited thereto, and a configuration may also be employed in which the fixed bus bars 50A to 50C are fixed to the frame 30 by means of various kinds of known fixing methods. For example, a configuration may also be employed in which press-fitting holes are provided in the frame 30, and the fixed bus bars 50A to 50C are press-fitted to the press-fitting holes in the frame 30.

Although the external terminals T are terminals at the end portions of the wires W1 to W3, the present invention is not limited thereto. For example, the external terminals T may also be terminals at end portions of bus bars that are connected to an external power source, devices, or the like.

The invention claimed is:

1. An electrical connection box comprising:
   a case;
   a frame that is made of a resin, a position of the frame being fixed relative to the case;
   a fixed terminal that is fixed to the frame and can be connected to an external terminal;
   a fuse having a terminal that is put over the fixed terminal;
   a fastening member for fastening the external terminal, the fixed terminal, and the terminal of the fuse together; and
   a holding member for holding the fastening member, the holding member removably attached to the frame,
   wherein the frame includes an attached portion integrally formed to an outer surface of the frame and configured to receive the holding member.

2. The electrical connection box according to claim 1, wherein the holding member includes a locking portion for locking the holding member to the attached portion so that the holding member can move within a range of a predetermined clearance.

3. The electrical connection box according to claim 1, wherein a fitting recessed portion into which at least a portion of an outer face of the fuse is fitted is formed in the holding member.

4. The electrical connection box according to claim 1, wherein an insertion groove portion into which the fastening member is inserted from a direction perpendicular to an axial direction of the fastening member is formed in the holding member.

5. The electrical connection box according to claim 1, further comprising:
    a circuit board on which an electronic component is mounted, the circuit board having a conducting path; and
    a fixed bus bar that has the fixed terminal and passes through the frame,
    wherein the fixed bus bar is connected to the conducting path of the circuit board.

6. The electrical connection box according to claim 1, wherein the fuse includes a pair of terminals, a blowing portion that is connected between the pair of terminals and blows out when an overcurrent runs therethrough, and an exterior portion covering the blowing portion,
    a visual check portion that enables the blowing portion to be visually checked is formed in the exterior portion, and
    a visual check hole for exposing the visual check portion is formed in the attached portion to pass therethrough.

7. The electrical connection box according to claim 2, wherein a fitting recessed portion into which at least a portion of an outer face of the fuse is fitted is formed in the holding member.

8. The electrical connection box according to claim 2, wherein an insertion groove portion into which the fastening member is inserted from a direction perpendicular to an axial direction of the fastening member is formed in the holding member.

9. The electrical connection box according to claim 3, wherein an insertion groove portion into which the fastening member is inserted from a direction perpendicular to an axial direction of the fastening member is formed in the holding member.

10. The electrical connection box according to claim 2, further comprising:
    a circuit board on which an electronic component is mounted, the circuit board having a conducting path; and
    a fixed bus bar that has the fixed terminal and passes through the frame,
    wherein the fixed bus bar is connected to the conducting path of the circuit board.

11. The electrical connection box according to claim 3, further comprising:
    a circuit board on which an electronic component is mounted, the circuit board having a conducting path; and
    a fixed bus bar that has the fixed terminal and passes through the frame,
    wherein the fixed bus bar is connected to the conducting path of the circuit board.

12. The electrical connection box according to claim 4, further comprising:
    a circuit board on which an electronic component is mounted, the circuit board having a conducting path; and
    a fixed bus bar that has the fixed terminal and passes through the frame,
    wherein the fixed bus bar is connected to the conducting path of the circuit board.

13. The electrical connection box according to claim 2, wherein the fuse includes a pair of terminals, a blowing portion that is connected between the pair of terminals and blows out when an overcurrent runs therethrough, and an exterior portion covering the blowing portion,
    a visual check portion that enables the blowing portion to be visually checked is formed in the exterior portion, and
    a visual check hole for exposing the visual check portion is formed in the attached portion to pass therethrough.

14. The electrical connection box according to claim 3, wherein the fuse includes a pair of terminals, a blowing portion that is connected between the pair of terminals and blows out when an overcurrent runs therethrough, and an exterior portion covering the blowing portion,
    a visual check portion that enables the blowing portion to be visually checked is formed in the exterior portion, and
    a visual check hole for exposing the visual check portion is formed in the attached portion to pass therethrough.

15. The electrical connection box according to claim 4, wherein the fuse includes a pair of terminals, a blowing portion that is connected between the pair of terminals and blows out when an overcurrent runs therethrough, and an exterior portion covering the blowing portion,
    a visual check portion that enables the blowing portion to be visually checked is formed in the exterior portion, and
    a visual check hole for exposing the visual check portion is formed in the attached portion to pass therethrough.

16. The electrical connection box according to claim 5, wherein the fuse includes a pair of terminals, a blowing portion that is connected between the pair of terminals and blows out when an overcurrent runs therethrough, and an exterior portion covering the blowing portion,
    a visual check portion that enables the blowing portion to be visually checked is formed in the exterior portion, and
    a visual check hole for exposing the visual check portion is formed in the attached portion to pass therethrough.

\* \* \* \* \*